(12) United States Patent
Hedler et al.

(10) Patent No.: US 6,861,291 B2
(45) Date of Patent: Mar. 1, 2005

(54) METHOD PRODUCING A CONTACT CONNECTION BETWEEN A SEMICONDUCTOR CHIP AND A SUBSTRATE AND THE CONTACT CONNECTION

(75) Inventors: Harry Hedler, Germering (DE); Barbara Vasquez, Munich (DE); Roland Irsigler, Munich (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 10/135,273

(22) Filed: Apr. 30, 2002

(65) Prior Publication Data

US 2003/0201452 A1 Oct. 30, 2003

(30) Foreign Application Priority Data

Apr. 30, 2001  (DE) ......................................... 101 20 928

(51) Int. Cl.⁷ .................. H01L 21/44; H01L 21/48; H01L 21/50
(52) U.S. Cl. ................... 438/119; 438/107; 438/458
(58) Field of Search ............................. 438/119, 458, 438/107

(56) References Cited

U.S. PATENT DOCUMENTS

| | | | | |
|---|---|---|---|---|
| 5,930,598 A | * | 7/1999 | Wille et al. ................ 438/108 |
| 6,350,631 B1 | * | 2/2002 | Kobayashi et al. ........ 438/107 |
| 6,359,035 B1 | * | 3/2002 | Ono et al. .................. 523/339 |
| 6,440,774 B2 | * | 8/2002 | Kobayashi et al. ........ 438/107 |
| 2001/0004131 A1 | * | 6/2001 | Masayuki et al. ......... 257/720 |
| 2002/0014703 A1 | * | 2/2002 | Capote et al. ............. 257/778 |
| 2002/0019072 A1 | * | 2/2002 | Kobayashi et al. ........ 438/107 |

FOREIGN PATENT DOCUMENTS

EP  1 067 598  1/2001

OTHER PUBLICATIONS

Abstract of Japanese Published Application 09115967 of May 2, 1997, *Patent Abstract of Japan*.
Abstract of Japanese Published Application 11054547 of Feb. 26, 1999, *Patent Abstracts of Japan*.
Abstract of Japanese Published Application 2000332058 of Nov. 30, 2000, *Patent Abstracts of Japan*.

* cited by examiner

*Primary Examiner*—George Fourson
*Assistant Examiner*—Michelle Estrada
(74) *Attorney, Agent, or Firm*—Schiff Hardin LLP

(57) ABSTRACT

A contact connection between a semiconductor chip and a substrate has a conductive adhesive extending between each contact of the chip and the substrate. The conductive adhesive includes a matrix component, a filler component, a hardener component and at least one decomposable component so that after curing at a curing temperature $T_1$, the adhesive can be decomposed either by applying thermal energy at a temperature $T_2 > T_1$ or by radiation so that the two contact surfaces can be separated smoothly. After separation the purposes of replacing a defective semiconductor chip, a second chip can be mechanically connected by applying the adhesive and curing it.

8 Claims, 2 Drawing Sheets

METHOD PRODUCING A CONTACT CONNECTION BETWEEN A SEMICONDUCTOR CHIP AND A SUBSTRATE AND THE CONTACT CONNECTION

BACKGROUND OF THE INVENTION

The present invention is related to a contact connection between a semiconductor chip and a substrate, in particular between a memory module chip and a memory module board and to the method of producing the contact connection. While the principles of the present invention are applicable to any desired semi-connection between a semiconductor chip and a substrate, the present invention and the problems on which it is based will be explained with reference to a memory module chip and a memory module board.

Contact connections in chip-on-board technologies may generally be implemented by using either solder connections or adhesive bond connections. Primarily, memory modules are fitted with a large number of individual chips, for example 32, in order to implement a desired module memory size. Although the individual chips are tested in advance and defective chips are removed, it may occur that the interplay of the individual chips on a module leads to functional failures. These failures are caused inter alia, by different signal propagation times in the individual chips. In this case, an individual chip or several chips on the module board must be replaced by new chips. For this purpose, the contact connections between the individual chip and module board must be detached again and the contact surfaces of the module board must be prepared for new contact connections for each chip being replaced.

In the case of the soldered connections the defective chip is heated locally above the melting temperature of the solder and removed from the module board by pulling. This process, which uses a lead-containing solder, is the most widespread one in chip mounting technology. With regard to environmental compatibility, however, attempts are being made to change over to a lead-free solder compound in the future. However, lead-free solders have the disadvantage of a higher melting point temperature which leads to the chip being subjected to considerable thermal loading during mounting. This thermal loading leads to a increased failure rate (retention fails) and therefore to a lower module yield.

Adhesive bonding connections can be cured at low temperatures that are less polluting. They will therefore increasingly replace solder connections in the future.

Adhesively bonded connections can be produced with either thermoplastic or thermosetting adhesives. Thermosetting adhesives can be detached again only under a considerable tensile force, even when heated above the glass temperature. In addition, adhesive residues can be removed from the module board only with great effort. Although thermoplastic adhesives can be easily detached when heated above the glass temperature, their adhesive capacity in the cured state is generally too low to ensure reliable connection between the chip and module board.

The production of memory modules therefore requires a possibility of detaching individual defective chips from the module board again and replacing them by new chips. The existing repair processes predominantly use polluting lead-containing solders or, in the event that the lead-free solders are used can be carried out only at elevated temperatures. Thermosetting adhesives are difficult to remove and thermoplastic adhesives are too unstable.

SUMMARY OF THE INVENTION

An object of the present invention is to produce electrically and mechanically reliable contact connection which is environmentally compatible and can be detached again as required by means of little effort and while maintaining a thermal budget.

This object is achieved by a contact connection between a semiconductor chip and a substrate, in particular, between a memory module chip and a memory module board which contact connection is produced by a method including the steps of providing a substrate which has a first contact surface, providing a semiconductor chip which has a second contact surface and applying a curable conductive adhesive to at least one of the first contact surface and the second contact surface or to both contact surfaces. The conductive adhesive has a matrix component, a filler component, a hardener component and at least one decomposable component which after curing at a temperature $T_1$ can be decomposed by applying energy which is either a thermal application at a higher temperature $T_2 > T_1$ or by applying radiation in such a way that the first contact surface and the second contact surface can be smoothly separated mechanically. The method further includes the steps of joining together the first contact surface to the second contact surface and then curing the adhesive to strengthen the contact connection mechanically.

The connection and the method is based on applying a curable conductive adhesive to either the first contact surface or the second contact surface or to both the first and second contact surface and the adhesive as a matrix component and a filler component with one of the components after curing at a temperature $T_1$ being decomposed either thermally at a temperature $T_2 > T_1$ or by means of radiation in such a way that the first contact surface and second contact surface can be smoothly separated mechanically.

Additional advantages and features of the invention will be readily apparent from the following description of a preferred embodiment, the drawings and claims.

BRIEF DESCRIPTION OF THE DRAWINGS

FIGS. 1a–1e show representation of various stages in a method of producing a contact connection between a memory module chip and a memory module board with:

FIG. 1a showing the connection;

FIG. 1b showing a step of decomposing the adhesive connection;

FIG. 1c showing the separating of the chip from the memory module board;

FIG. 1d showing applying a new adhesive to a new chip to be subsequently connected to the module board; and FIG. 1e showing the second connection of the new chip.

DESCRIPTION OF A PREFERRED EMBODIMENT

Figure 1A:
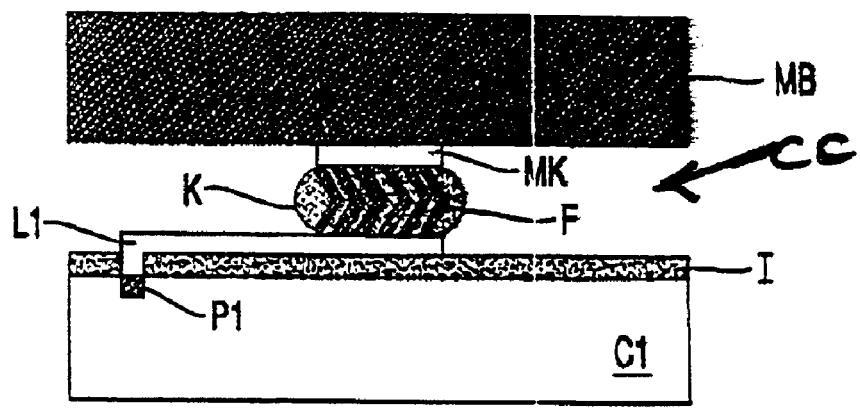

For the purposes of promoting an understanding of the principles of the invention, reference will now be made to the preferred embodiment illustrated in the drawings and specific language will be used to describe the same. It will nevertheless be understood that no limitation of the scope of the invention is thereby intended, such alterations and further modifications in the illustrated device, and/or method, and such further applications of the principles of the invention as illustrated therein being contemplated as would normally occur now or in the future to one skilled in the art to which the invention relates.

A preferred embodiment of the invention uses either a complete or partial decomposition of the adhesive matrix and the adhesive compound. Partial decomposition can be carried out, for example, by admixing suitable sacrificial substances. The decomposition of the substance leads to a loosening of the contact connection between the module chip and the module board. In this case, the decomposition of the adhesive matrix or sacrificial substance can be brought about, for example, by applying energy which is either thermal energy or ultraviolet irradiation. As a result, the thermal loading on the chip is kept within limits. In addition, as a result of the decomposition of the adhesive compound, the effort for he cleaning of the contact points on the module board is minimized or can be completely avoided. The decomposable substance can be matched to the requirements, for example, thermal budget of the chip or the module board.

The procedure according to the embodiments permits the combination of the following desired features of the contact connections:
the use of environmentally friendly adhesive compounds,
a reduction in the process temperature through the use of adhesives with a low curing temperature, and
simple detachment of the contact connection by means of a decomposition of the conductive adhesive, which does not damage the chip.

According to one preferred development, the contact connection is decomposed thermally or by means of radiation in such a way that the first contact surface and the second contact surface can be smoothly separated mechanically.

According to another preferred development, the first contact surface and the second contact surface are smoothly separated mechanically and the semiconductor chip is removed and another semiconductor chip is fitted in its place by means of an appropriate contact connection.

According to a further preferred development, the matrix component can be cured at a temperature $T_1$ and decomposed at a temperature $T_2>T_1$.

According to a yet another preferred development, the filler material consist of conductive solid particle.

According to another preferred development the decomposition is carried out by means of ultraviolet radiation.

According to a preferred development, the conductive adhesive has polymers selected from a group consisting of epoxy, polyamide and silicone as a matrix component K; a hardener H selected from a group consisting of acrylic amino groups, cyclic amino groups, anhydrides, isocyanate compounds, melamine compounds, axiridin compounds and other substances. The conductive adhesive also has a filler component or material F selected from a group consisting of Ag, Ni, Au, Cu, C, C, Al, Pt, Si and metal-coated particles and at least one decomposable component Z, which is selected from thermally decomposable components and UV-decomposable (depolymerizable) component which will decompose at a temperature $T_2$ into volatile or gaseous substances. The thermally decomposable substances considered, for example, include azide groups, polyoxylates and polycarbonates. The ultraviolet decomposable substances are selected from a group consisting of poly(oxy-2, 4-oxanediyl-methylenes) or di aryliodonium hexafluoroantimonate.

In FIG. 1, a memory module board MB is provided with a first contact surface MK. Also provided is a memory chip C1 which has an integrated memory circuit which is not illustrated. The memory chip C1 has a connection pad P1 and an insulating layer I which covers that surface on which the connection pad P1 is provided and the insulating layer I has a contact opening over the contact pad P1 so that a conductor track Li which lies on the insulating layer I can be connected to the pad P1 to form a second contact surface for the contact connection to be produced between the memory module MB and the memory chip C1.

The connection is attained by means of a specific adhesive which has a matrix component K and a filler component F. As a result of the contact connection CC is formed. The contact connection CC which is stable, but can easily be detached if required can be produced between the memory chip board MB and the memory module C1. Detachability is based on the fact that by means of a decomposable component, the matrix component of the adhesive is dissolved, either completely or partially by means of ultraviolet radiation or the supply of thermal energy in such a way that the first contact surface MK and the second contact surface L1 can be smoothly separated mechanically.

Figure 1B:
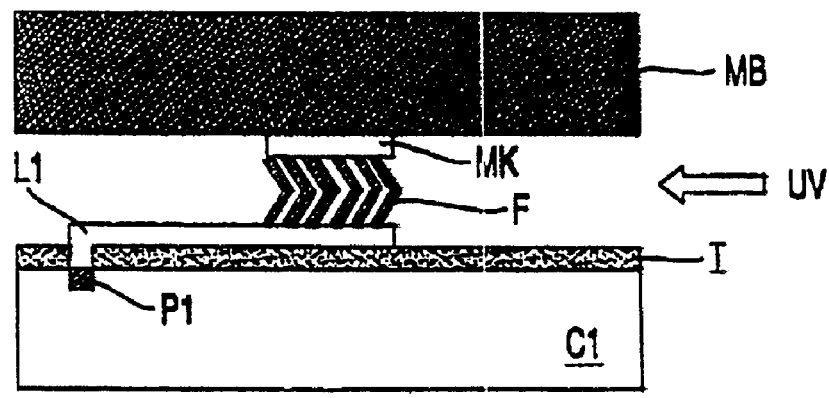

As illustrated in FIG. 1b, irradiation and dissolution of the matrix material K occurs due to ultraviolet radiation UV indicated by the arrow UV. The necessary curing temperature can be set via the hardener in such a way that the thermal loading of the chip is kept within limits as apposed to the conventional soldering method. As a result of the complete or partial dissolution of the matrix component K, the effort of cleaning of the contact surfaces MK and L1 is either minimized or avoided.

Figure 1C:
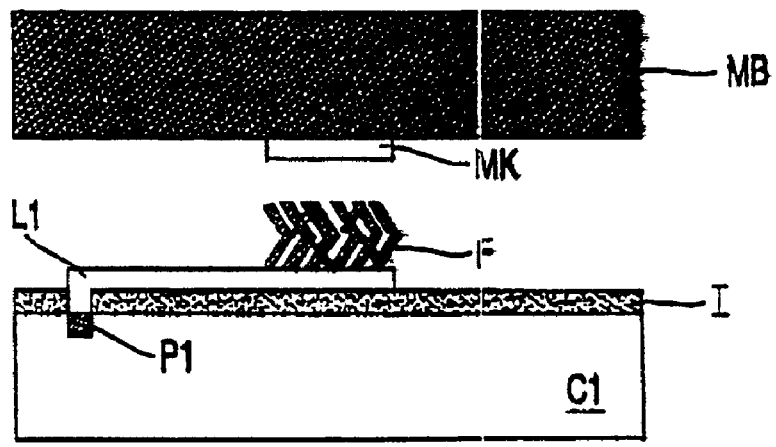

In the present ideal case, as shown in FIG. 1c, only conductive metallic particles of the filler component F remain on the second contact surface L1 after the memory module board MB and the memory module chip C1 have been separated and these conducting metallic particles can be easily removed.

Figure 1D:
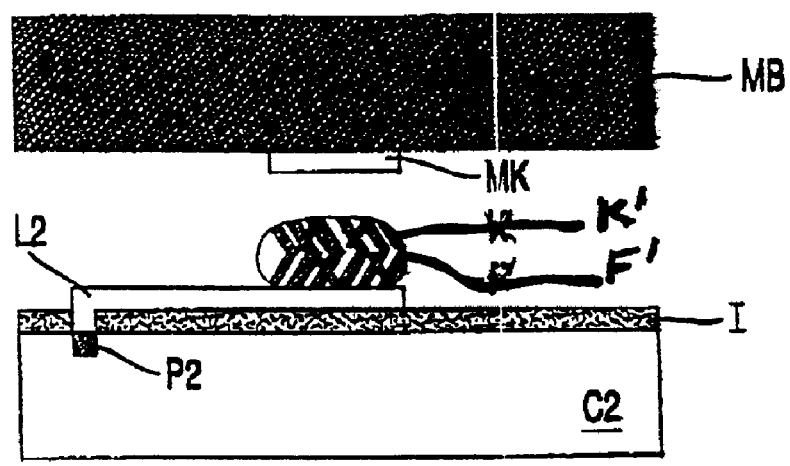
Figure 1E:
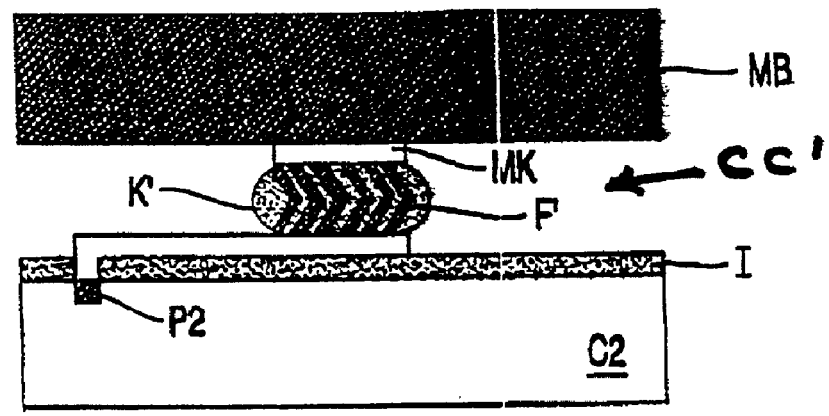

Another and new module chip C2 as shown in FIG. 1d is then connected to the memory module board MB. For this purpose a drop of the special adhesive with the matrix component K' and a filler component F' is again applied in a metered manner to a second contact surface L2 of the new memory chip C2. After that, the two components are joined together and the adhesive is cured appropriately, a new contact connection generally indicated as CC' in FIG. 1e is formed.

While as the embodiment was described above with regards to memory module boards and memory module chips, the contact connection can be used between any desired chip and substrate.

While a preferred embodiment has been illustrated and described in detail in the drawings and foregoing description, the same is to be considered as illustrative and not restrictive in character, it being understood that only the preferred embodiment has been shown and described and that all changes and modifications that come within the spirit of the invention both now or in the future are desired to be protected.

We claim:

1. A method of producing a contact connection between a semiconductor chip and a substrate, said method comprising steps of providing a substrate having a first contact surface, providing a semiconductor chip having a second contact surface, applying a curable conductive adhesive to at least one of the first contact surface and the second contact surface, the conductive adhesive having a matrix component, a filler component consisting of conductive solid particles, a hardener component and at least one decomposable component which after curing at a temperature $T_1$ can be decomposed by applying energy selected from radiation energy and thermal energy at a higher temperature $T_2>T_1$ so that the first contact surface and the second contact surface can be smoothly separated mechanically, joining the first contact surface and second contact surface together and curing the adhesive to strengthen the contact connection mechanically.

2. A method according to claim 1, which, subsequent to the step of curing the adhesive, includes decomposing the contact connection by applying energy selected from thermal energy and radiation energy and then smoothly separating the first and second contact surfaces mechanically.

3. A method according to claim 2, which, after the step of mechanically separating the first and second contact surfaces, includes removing the semiconductor chip and mounting another semiconductor chip in place by means of an appropriate contact connection.

4. A method according to claim 1, wherein the matrix component can be cured and is dissolved by the admixing of the decomposable component.

5. A method for producing a contact connection between a semiconductor chip and a substrate, said method comprising the steps of providing a substrate having a first contact surface, providing a semiconductor chip having a second contact surface, applying a curable conductive adhesive to at least one of the first contact surface and the second contact surface, the conductive adhesive having a matrix component, a filler component, a hardener component and at least one decomposable component which, after curing at a temperature $T_1$ can be decomposed by applying ultraviolet radiation so that the first contact surface and the second contact surface can be smoothly separated mechanically, said decomposable component being selected from a group of materials consisting of poly(oxy-2, 4-oxanediyl-methylefles) and di-aryliodonium hexafluoroantimonate, joining the first contact surface and second contact surface together and curing the adhesive to strengthen the contact connection mechanically.

6. A method according to claim 5, wherein the matrix component of the conductive adhesive is a polymer selected from a group consisting of epoxy, polyamide and silicone, the filler component is selected from a group consisting of Ag, Ni, Au, Cu, C, Al, Pt, Si and metal-coated particles and the hardener component is selected from a group consisting of acrylic amino groups, cyclic amino groups, anhydrides, isocyanate compounds, melamine compounds and aziridin compounds.

7. A method according to claim 1, wherein the decomposition is carried out by applying thermal energy, and the matrix component of the conductive adhesive is a polymer selected from a group consisting of epoxy, polyamide, and silicone; the filler component is selected from a group consisting of Ag, Ni, Au, Cu, C, Al, Pt, Si and metal-coated particles, the hardener is selected from a group consisting of acrylic amino groups, cyclic amino groups, anhydrides, isocyanate compounds, melamine compounds and aziridin compounds; and the decomposable component is selected from groups consisting of azide groups, polyoxylates and polycarbonates.

8. A method according to claim 1, wherein the substrate consists of another semiconductor chip.

* * * * *